(12) United States Patent
Wakabayashi et al.

(10) Patent No.: US 7,514,120 B2
(45) Date of Patent: Apr. 7, 2009

(54) PRECOAT FILM FORMING METHOD

(75) Inventors: Satoshi Wakabayashi, Nirasaki (JP); Toshio Hasegawa, Yamanashi-Ken (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/079,294

(22) Filed: Mar. 15, 2005

(65) Prior Publication Data

US 2005/0221005 A1    Oct. 6, 2005

Related U.S. Application Data

(63) Continuation of application No. 10/396,713, filed on Mar. 26, 2003, now abandoned, which is a continuation-in-part of application No. 09/711,900, filed on Nov. 15, 2000, now abandoned.

(30) Foreign Application Priority Data

Nov. 17, 1999  (JP) ............................. 1999-327059
Jan. 13, 2000  (JP) ............................. 2000-004993

(51) Int. Cl.
*C23C 16/00* (2006.01)

(52) U.S. Cl. .................... 427/255.36; 427/255.394; 427/255.7

(58) Field of Classification Search .......... 427/255.391, 427/248.1; 438/685
See application file for complete search history.

(56) References Cited

U.S. PATENT DOCUMENTS

| 5,308,655 | A | * | 5/1994 | Eichman et al. .......... 427/248.1 |
| 5,567,483 | A | | 10/1996 | Foster et al. |
| 5,665,640 | A | | 9/1997 | Foster et al. |
| 5,942,282 | A | * | 8/1999 | Tada et al. .................. 427/250 |
| 5,943,600 | A | | 8/1999 | Ngan et al. |
| 5,963,834 | A | | 10/1999 | Hatano et al. |
| 6,071,573 | A | * | 6/2000 | Koemtzopoulos et al. ... 427/578 |
| 6,238,964 | B1 | | 5/2001 | Cho |
| 6,251,758 | B1 | | 6/2001 | Chern et al. |
| 6,383,302 | B2 | * | 5/2002 | Urabe ........................ 118/725 |

FOREIGN PATENT DOCUMENTS

| JP | 62085425 | 4/1987 |
| JP | 6188205 | 7/1994 |
| KR | 1998-64042 | 10/1998 |

OTHER PUBLICATIONS

Korean Office Action issued on Jun. 21, 2006 for counterpart Korean Application No. 10-2000-0067914.

* cited by examiner

*Primary Examiner*—Timothy H Meeks
*Assistant Examiner*—David Turocy
(74) *Attorney, Agent, or Firm*—Smith, Gambrell & Russell, LLP

(57) ABSTRACT

The precoat film forming method of a film forming device having a loading table for loading the object, includes a deposition step of feeding processing gas inside the film forming device and depositing a precoat TiN film on the surface of the loading table and a stabilization step of reducing and stabilizing the precoat film on the loading table, wherein the precoat film formed on the loading table at the deposition step has a film thickness within a range such that even if the film thickness of the precoat film changes, a radiation heat quantity from the loading table becomes generally constant. Therefore, as the thermal stability is maintained at the film forming process of semiconductor wafers, it is possible to improve the reproducibility in the film forming process.

10 Claims, 7 Drawing Sheets

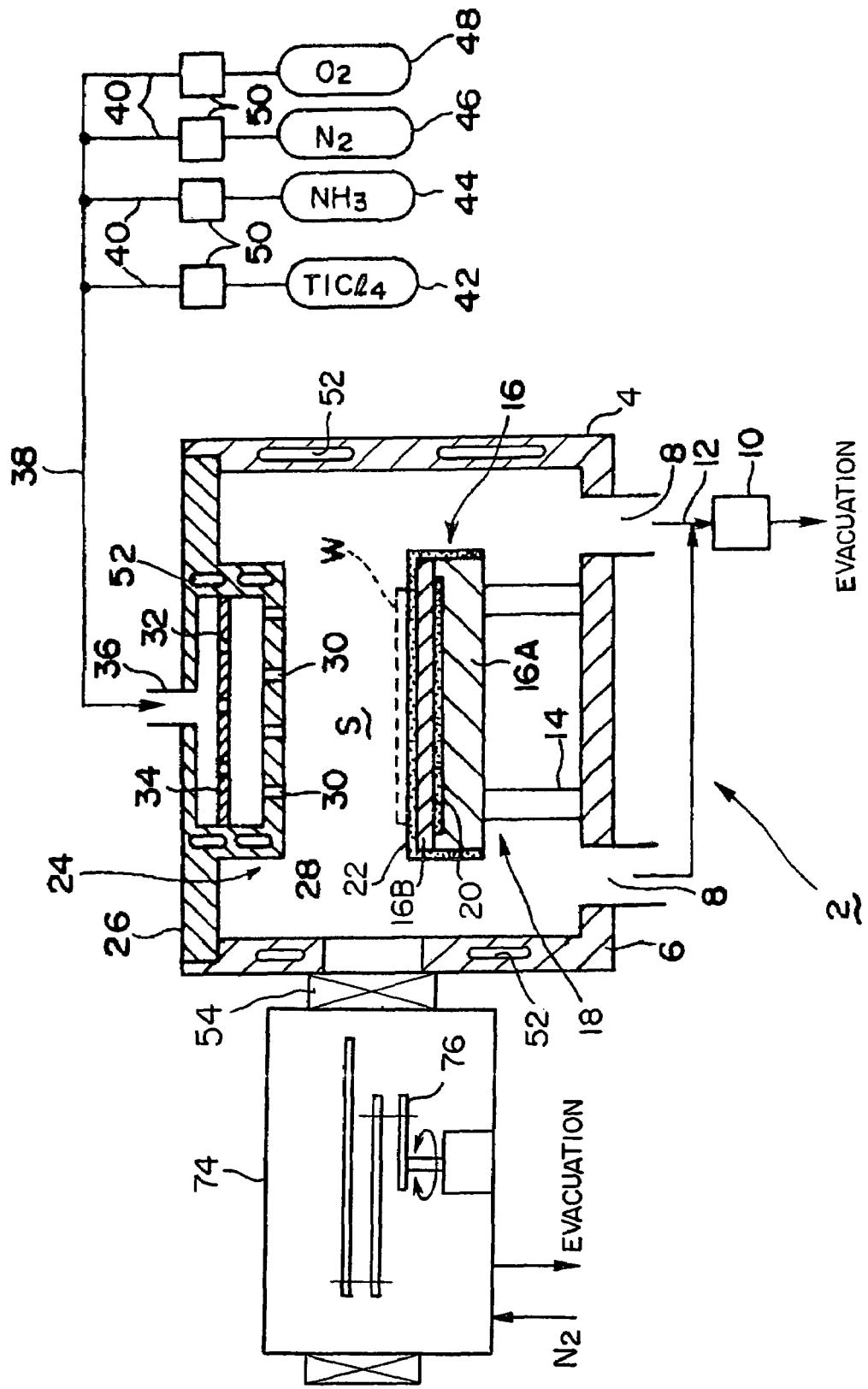
FIG. I

| LOT | PRECOAT THICKNESS (μm) | NUMBER OF WAFERS (pcs.) | | | | UNIFORMITY (%) |
|---|---|---|---|---|---|---|
| | | 1 | 23 | 24 | 49 | |
| A | 0.2 | 118.3 | | 121.15 | 125.97 | 3.10 |
| B | 0.5 | 128.9 | 130.4 | | 132.8 | 1.50 |
| C | 1.0 | 138.2 | 135.5 | | 135.5 | 1.00 |

PRECOAT FILM FORMING METHOD

CROSS REFERENCE TO RELATED APPLICATION

The present application is a continuation of Ser. No. 10/396,713, filed Mar. 26, 2003 now abandoned, which is a continuation-in-part of Ser. No. 09/711,900, filed Nov. 15, 2000 now abandoned and which are incorporated herein in their entirety by reference.

BACKGROUND OF THE INVENTION

1. Field of the Invention

The present invention relates to a precoat film forming method.

2. Description of the Related Art

Generally, in manufacture of semiconductor integrated circuits, film forming and pattern etching are carried out repeatedly for a silicon substrate such as a semiconductor wafer or others and many desired elements are formed.

Meanwhile, for a lower layer of a wiring layer for enabling wiring between the elements and electric contact of the elements, for the purpose of suppressing interdiffusion between Si of the substrate and the wiring material or for the purpose of preventing peeling from the primary coat, a barrier metal is used. For the barrier metal, a material having not only a low electric resistance but also an outstanding corrosion resistance must be used. As a barrier metal material for satisfying such as request, a TiN film is especially apt to be used frequently.

To form a barrier metal of a TiN film, generally a very thin Ti film is formed by plasma CVD and nitride-treated and then a TiN film is formed by thermal CVD using $TiCl_4$ and $NH_3$ gas.

Here noted that the thermal CVD means forming a film by thermochemical reaction without using a plasma.

The process temperature at the time of forming the Ti film must be controlled particularly strictly so as to highly keep the film characteristics in the same way as with forming of a general thin film.

On the surface of a loading table for loading a semiconductor wafer, a precoat film composed of a TiN film is generally formed beforehand for the purpose of holding the thermal intra-surface uniformity of the wafer and preventing metal contamination caused by the metallic element included in the loading table. The precoat film is removed every cleaning inside the film forming device, so, when it is cleaned, a precoat film is thinly deposited on the surface of the loading table as a pretreatment prior to actual forming of a film on the wafer.

Meanwhile, the precoat film is formed, for example, in a high temperature zone such as about 680° C. and as mentioned above, when it formed once, it is used continuously over a long period of time until the inside of the film forming device is cleaned next. In this case, when a so-called idling period which is not used for the film forming process occurs, the temperature is lowered to a temperature at which the quality of the precoat film is not changed, for example, about 300 to 500° C. and the precoat stands by.

The temperature changing operation and temperature stabilization operation of the loading table require a lot of time, so that it is desirable to keep the loading table temperature at the process temperature of TiN film forming from the viewpoint of improving the throughput. However, if the loading table is exposed at a high temperature, for example, about 680° C., the precoat film is degenerated due to a very small quantity of outer gas in the processing container and a very small quantity of leak gas, and the emissivity and transmission factor are changed. After all, although the temperature is controlled in the same way, heat is easily radiated from the loading table due to changing of the emissivity and transmission factor. Thereby, the supply electric energy is increased and the wafer temperature is apt to become higher than expected.

FIG. 7 is a graph showing the condition at this time and it shows changes of the film quality (specific resistance) when a precoat film is deposited on the loading table in the film forming device and a TiN film is immediately formed at a process temperature of about 680° C. and thereafter, when the loading table is conditioned at about 680° C. for 17 hours and then a film is formed. The drawing shows that the specific resistance of the TiN film after conditioning for 17 hours is reduced about 50 $\mu\Omega \cdot cm$ compared with that before conditioning. This means that as converted to a wafer temperature, the temperature after conditioning for 17 hours is higher by about 20° C.

In view of such a matter, conventionally, during a period of idling of the film forming device as mentioned above, the temperature of the loading table is lowered to about 300 to 500° C. and further inert gas such as $N_2$ gas is fed, thereby the degeneration of the precoat film causing instability of the wafer temperature is prevented.

As a result, the temperature changing operation and temperature stabilization operation of the loading table require a lot of time and even if it is intended to restart the film forming process, a quick process cannot be performed and a large decrease of the throughput is caused.

The present invention has been developed to solve the aforementioned problems effectively by taking notice of them. An object of the present invention is to provide a precoat film forming method, a loading structure, and a film forming device for not requiring to lower the temperature of a loading table even during a period of idling by stabilizing a precoat film, thereby improving the throughput.

Meanwhile, in making the TiN films deposit on wafers practically, it is required that the TiN films formed on the wafers processed one by one successively have a substantially constant film thickness with high accuracy in view of an improvement in the electrical characteristics of a semiconductor integrated circuit. In other words, it is necessary to maintain the uniformity (or called "reproducibility") in film thickness among respective surfaces of the wafers highly.

Nevertheless, in the conventional processing apparatus, it has not been attempted to take a lot of time for the formation of a precoat film in order to enhance the operating rate of the apparatus. For example, by the previously-mentioned thermal CVD, a precoat film having the order of 0.2 μm in film thickness has been formed up to now.

In this case, however, if the formation process of TiN films on semiconductor wafers is started after the formation process of the precoat films has been completed and successively stabilized, then there arises a problem that the film thickness of TiN films formed on some wafers processed initially varies in instability.

The present invention has been developed to solve the aforementioned problem effectively by focusing attention on it. An object of the present invention is to provide a loading table capable of thermal stability, thereby making an excellent reproducibility in terms of film thickness, and further provide a processing apparatus and a processing method.

As a result of studying a precoat film formed on the loading table diligently, the inventors of the present invention have obtained a knowledge that, if only forming a precoat film of film thickness so as to attain a generally constant radiation heat quantity from the loading table, it is possible to improve the reproducibility of film formation since the thermal stability is maintained at the subsequent film-forming process on the semiconductor wafers, thereby accomplishing the present invention.

Another object of the present invention is to provide an idling method of a film forming device for feeding predetermined gas during a period of idling without stabilizing a precoat film, thereby not requiring decreasing of the temperature of a loading table even during a period of idling, thereby improving the throughput.

On the other hand, there is the following problem imposed also regarding the film forming method for a semiconductor wafer.

Namely, when a film is to be deposited on the surface of a semiconductor wafer, in order to keep the electric characteristics of the deposited film uniform, it is necessary to deposit a film in the same condition always or everyday and maintain the reproducibility highly. In a semiconductor wafer processing device represented by a film forming device, even if the same process conditions are set, the operation condition of the processing device itself may be varied delicately with various factors, so that periodically or non-periodically, for example, a film is deposited on a test semiconductor wafer every morning and the sheet resistance is measured, and the operation condition of the processing device at that time is checked.

Further, also to maintain the electric characteristics of the semiconductor integrated circuit itself as designed, it is desirable that a deposited film maintains the sheet resistance which is a desired value.

Meanwhile, although it is desirable that the sheet resistance of a deposited film is always constant ideally, actually, it is found that according to the process temperature at film forming time and the conditioning time from film forming to measurement of the sheet resistance, the sheet resistance itself is changed greatly and the change with time is large. The cause is seemed to be that the deposited film is oxidized by $H_2O$ or $O_2$ in the atmosphere.

As a result, even if the sheet resistance of a deposited film of a test wafer is measured and checked every morning in order to ascertain the operation condition of the film forming device, when the time from film forming to measurement is varied with a day, for example, even when the film forming device itself is operated under the same condition, the sheet resistance is greatly shifted and as a result, a problem arises that the film forming device is adjusted unnecessarily or a reverse case occurs.

When the sheet resistance itself of a deposited film is varied with time like this as mentioned above, a problem arises that it is difficult to manufacture a semiconductor integrated circuit as designed.

This respect will be explained hereunder by referring to FIGS. 8 and 9. FIG. 8 is a graph showing the relationship between the process temperature at the time of forming a TiN film and the oxygen (O) concentration in the film after conditioning for three days in the atmosphere after film forming. FIG. 9 is a graph showing the process temperature at the time of forming a TiN film and the change rate of the sheet resistance after conditioning for three days in the atmosphere after film forming. The graph in FIG. 8 shows that when the process temperature is about 530° C., the oxygen concentration after three days is considerably high such as 4 atms %, while when the process temperature is about 700° C., the oxygen concentration after three days is considerably low such as 1.5 atms %.

FIG. 9 shows the ratio of the sheet resistance immediately after film forming to the sheet resistance three days after the film is conditioned for three days in the atmosphere, and when the process temperature is about 530° C., the sheet resistance after three days is increased to about two times (100%), and when the process temperature is about 700° C., the sheet resistance after three days is decreased to about 1.1 times (10%), and in either case, the change rate is higher than 5% which is a target, and it is desired to suppress this change rate smaller early.

The present invention has been developed to solve the aforementioned problems effectively by taking notice of them. An object of the present invention is to provide a film forming method for suppressing the change with time of the sheet resistance greatly.

SUMMARY OF THE INVENTION

The inventors have accomplished the present invention, as a result of finding that the reason why the change of substance of precoat TiN film occur is that there is unstable site in a level of size of molecule and the site react to other atom gradually for a long time, after their long devotion to research.

The present invention is characterized in that, in a film forming device having a loading table for loading an object to be processed inside, a precoat film forming method includes a deposition step of feeding processing gas inside the film forming device and depositing a precoat TiN film on the surface of the loading table and a stabilization step of reducing and stabilizing the precoat film on the loading table, wherein the precoat film formed on the loading table at the deposition step has a film thickness within a range such that even if the film thickness of the precoat film changes, a radiation heat quantity from the loading table becomes generally constant.

Further, the present invention is characterized in that the film thickness of the precoat film is 0.5 μm at minimum.

It is possible to improve the reproducibility of film formation if forming a precoat film of film thickness so as to attain a generally constant radiation heat quantity from the loading table, since the thermal stability is maintained at the subsequent film-forming process on the semiconductor wafers. Further the precoat TiN film can be stabilized by exposing and annealing in reducing gas like this. By doing this, during a period of idling the film forming device, there is no need to lower the temperature of the loading table, and hence the time required for raising the temperature at start time of film forming on an object to be processed is not needed, and the throughput can be improved in correspondence to it.

Also the present invention is characterized in that the reducing reaction at the stabilization step is carried out by exposing the precoat film in $NH_3$ (ammonia) containing gas.

The present invention is characterized in that the temperature of the loading table at the stabilization step is almost the same as the process temperature when the film forming process is performed for the aforementioned object to be processed in the film forming device.

By doing this, after stabilization of the precoat film, the operation can be moved to the film forming process of the object to be processed immediately without changing the temperature of the loading table, so that the throughput can be improved more.

The present invention is characterized in that in the film forming device, a Ti film or a Ti containing film is deposited on the object to be processed.

The present invention is characterized in that a film forming device having a loading table for loading an object to be processed inside has a deposition step of feeding processing gas inside the film forming device and depositing a precoat TiN film on the surface of the loading table and a stabilization step of oxidizing and stabilizing the precoat film on the loading table by keeping it at a temperature higher than the temperature at the deposition step.

The precoat TiN film can be stabilized by exposing and annealing in oxidizing gas like this. By doing this, during a period of idling the film forming device, there is no need to lower the temperature of the loading table, and hence the time required for raising the temperature at start time of film forming on an object to be processed is not needed, and the throughput can be improved in correspondence to it.

The present invention is characterized in that the oxidizing reaction at the stabilization step is carried out by exposing the precoat film in $O_2$ (oxygen) containing gas or $H_2O$ (moisture) containing gas.

The present invention is characterized in that the temperature of the loading table at the stabilization step is almost the same as the process temperature when the film forming process is performed for the aforementioned object to be processed in the film forming device.

By doing this, after stabilization of the precoat film, the film forming process of the object to be processed can be performed immediately without changing the temperature of the loading table, so that the throughput can be improved more.

The present invention is characterized in that in the film forming device, a Ti film or a Ti containing film is deposited on the object to be processed.

The present invention is characterized in that in an idling method of a film forming device having a loading stable with a precoat TiN film formed on the surface in a processing container which can be evacuated so as to form a Ti film or a TiN film on an object to be processed, $NH_3$ containing gas is fed into the processing container.

By doing this, there is no need to stabilize the precoat TiN film and only by feeding $NH_3$ containing gas for the idling period, for example, even when the loading table is kept at the film forming process temperature, the precoat film can be prevented from degeneration. Therefore, the time required for raising the temperature at start time of film forming on an object to be processed is not needed, and the throughput can be improved in correspondence to it.

The present invention is characterized in that the temperature of the loading table is kept at almost the same temperature as the temperature at the time of the film forming process which is performed in the processing container.

The present invention is characterized in that in a film forming device for performing the film forming process for depositing a Ti film or a Ti containing film on an object to be processed, a loading table installed in order to load the object to be processed and a precoat TiN film which is formed on the surface of the loading table and subjected to the stabilization process are installed.

The present invention is characterized in that a film forming device for forming a Ti film or a Ti containing film on an object to be processed, includes: a processing container which can be evacuated, gas feed means for feeding necessary processing gas into the processing container, a loading table structure having a loading table for loading the object to be processed, and a precoat Ti film which is formed on a surface of the loading table and subjected to a stabilization process; and heating means for heating the object to be processed.

The present invention is characterized in that a film forming method for performing the film forming process of depositing a predetermined film on the surface of an object to be processed using high-melting point metallic compound gas and reducing gas in a processing container which can be evacuated feeds oxidizing gas into the processing container during or immediately after the film forming process.

By feeding oxidizing gas into the processing container during or immediately after the film forming process like this, oxygen is positively taken into the deposited film or oxygen is positively taken into the surface of the deposited film, thereby the deposited film is stabilized on a chemical composition basis and as a result, the change of the sheet resistance with time can be suppressed.

The present invention is characterized in that the aforementioned high-melting point metallic compound gas is $TiCl_4$ gas and the aforementioned reducing gas is $NH_3$ gas.

The present invention is characterized in that the aforementioned oxidizing gas is $O_2$ gas.

The present invention is characterized in that the aforementioned oxidizing gas is $H_2O$ gas.

BRIEF DESCRIPTION OF THE DRAWINGS

FIG. 1 is a schematic view showing a film forming device to which the loading table structure and film forming method of the present invention are applied.

FIGS. 2A, 2B, and 2C show the condition before a precoat film is formed, the condition that a precoat film is formed, and the stabilization step respectively.

DESCRIPTION OF THE PREFERRED EMBODIMENTS

The embodiments of the present invention will be explained hereunder with reference to FIGS. 1 to 4.

Firstly, the embodiments of a precoat film forming method, an idling method of a film forming device, a loading table structure, and a film forming device will be explained with reference to FIGS. 1 to 4.

Figure 2A:
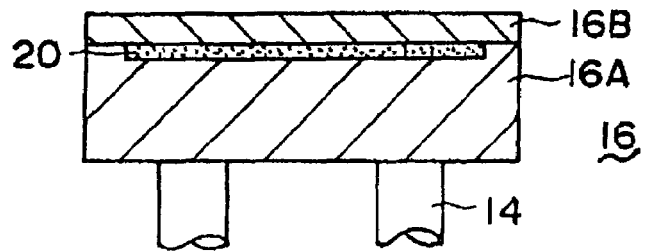
FIGS. 2A, 2B, and 2C are drawings showing the steps of forming a precoat film on a loading table using $NH_3$ gas.
Figure 2B:
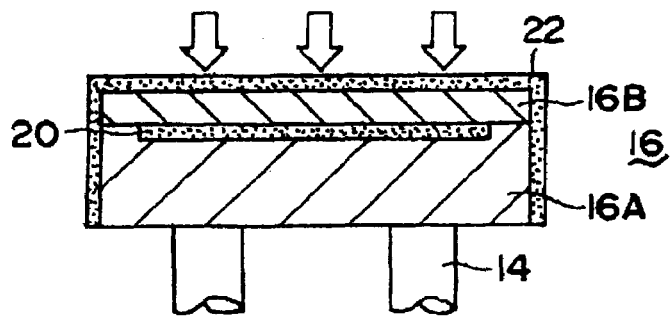
Figure 2C:
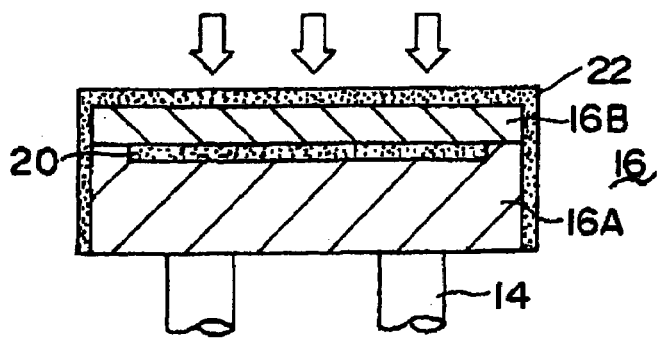
Figure 5:
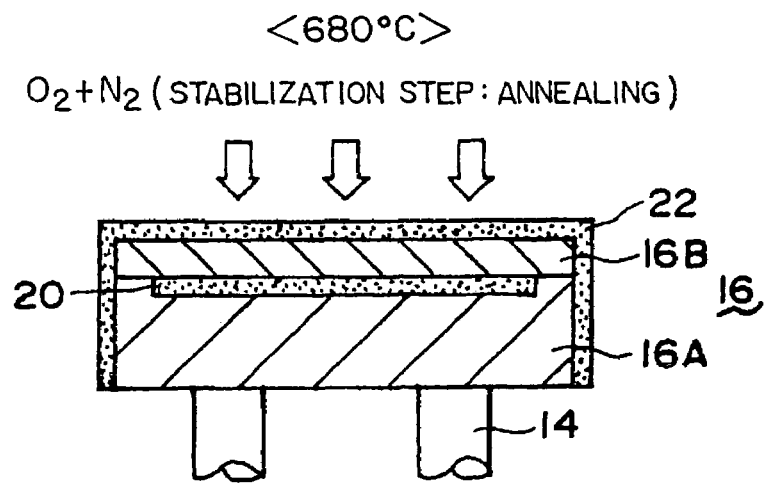
FIG. 5 is a drawing showing the step of stabilizing a precoat film on a loading table using $O_2$ gas.

FIG. 1 is a schematic view showing a film forming device having the loading table structure of the present invention, and FIGS. 2A to 2C are a step drawing showing the steps of forming and stabilizing a precoat film on a loading table using NH₃ gas, and FIG. 5 is a step drawing showing the step of stabilizing a precoat film on a loading table using O₂ gas.

In this embodiment, a case that a TiN film is formed by a film forming device will be explained as an example.

As shown in the drawing, a film forming device 2 has a processing container 4 formed in a cylindrical shape using, for example, stainless steel. In a bottom 6 of the processing container 4, an exhaust vent 8 for exhausting the atmosphere in the container is formed, and an exhaust system 12 with an evacuation pump 10 installed is connected to the exhaust vent 8, and the processing container 4 can be internally evacuated uniformly from the peripheral part of the bottom.

In the processing container 4, a loading table structure 18 has a support 14 and a circular loading table 16 supported on it is installed. On the circular loading table 16, for example, a semiconductor wafer W is loaded as an article to be processed. Concretely, the loading table 16 has a lower table 16A made of ceramics such as, for example, AlN which is directly supported by the support 14 and an upper table 16B made of AlN which is joined to the top thereof. Between the junction surfaces thereof, a resistance heater 20 is held as a heating means. The lower table 16A and the upper table 16B are joined on the junction surfaces by, for example, bonding. On the surface of the loading table 16, that is, on the side of the lower table 16A and the side and top of the upper table 16B, a stabilized precoat film 22 composed of a TiN film which is a characteristic of the present invention is formed overall. The thickness of the precoat film 22 is, for example, about 1 μm and the film forming and stabilization process will be described later.

On the other hand, on the ceiling part of the processing container 4, a ceiling part 26 where a shower head 24 is integratedly installed as a gas feed means for feeding necessary processing gas is air-tightly attached against the side wall of the container. The shower head 24 is installed opposite to the loading table 16 so as to cover almost overall the top thereof and a processing space S is formed between the shower head 24 and the loading table 16. The shower head 24 introduces various gases into the processing space S in showers. In an injection surface 28 at the bottom of the shower head 24, many injection holes 30 for injecting gas are formed. Inside the shower head 24, a diffusion plate 34 having many diffusion holes 32 is installed and gas can be diffused.

On the upper part of the shower head 24, a gas introduction port 36 for introducing gas into the head is installed. To the gas introduction port 36, a feed path 38 for letting gas flow is connected. To the feed path 38, a plurality of branch pipes 40 are connected. To each branch pipe 40, as film forming gas, for example, a TiCl₄ gas source 42 for collecting TiCl₄ gas and an NH₃ gas source 44 for collecting NH₃ gas and as inert gas, for example, an N₂ gas source 46 for collecting N₂ gas and an O₂ gas source 48 for collecting O₂ gas are connected. Each gas flow rate is controlled by a flow rate controller installed to each branch pipe, for example, a mass flow controller 50. Here, a case that each gas at film forming time is fed in one feed path 38 in a mixed state is indicated. However, the present invention is not limited to it and a so-called post mix gas transfer configuration that a part of gases or all gases are fed individually in different paths and mixed in the shower head 24 or the processing space S may be used. By doing this, reaction products of TiCl₄ and O₂ can be prevented from adhering inside the feed path.

On the side wall of the processing container 4 and the side wall of the shower head 24, in order to control the temperature of each side wall, a temperature control jacket 52 for selectively feeding, for example, a cooled or heated thermal medium as required is installed respectively. On the side wall of the container, a gate valve 54 which can be opened or closed air-tightly during transfer of a wafer is installed. Although not shown in the drawing, needless to say, a wafer lifter pin for lifting or lowering a wafer during transfer of the wafer is installed. On the side wall of the processing container 4, a load lock chamber 74 which can be evacuated is installed so as to be interconnected via the gate valve 54. In the load lock chamber 74, a multi-joint arm 76 for transferring the wafer W is installed so as to freely rotate, extend and retract. Also into the load lock chamber 74, N₂ gas can be fed as required. In place of the load lock chamber 74, a transfer chamber may be installed, though it is no particular object. To the load lock chamber 74, a cassette chamber not shown in the drawing is connected.

Next, the forming method for a precoat film of the present invention which is executed using a device structured as mentioned above will be explained by referring to FIGS. 2A, 2B, 2C, 3, 4 and 5.

Firstly, the loading table 16 in the processing container 4 is set in the state that no semiconductor wafer W is loaded, and the processing container 4 is closed. The processing container 4 is in the state that for example, the cleaning process is performed at the prestep and unnecessary films are all removed, thereby no precoat film is adhered to the surface of the loading table 16 as shown in FIG. 2A, and the material of the loading table 16 is exposed.

When the processing container 4 is enclosed, TiCl₄ gas and NH₃ gas as film forming gas and N₂ gas as carrier gas are introduced into the processing container 4 from the shower head 24 respectively at a predetermined flow rate. The processing container 4 is evacuated by the evacuation pump 10 and kept at a predetermined pressure.

The loading table 16 at this time is heated and kept at a predetermined temperature by the resistance heater 20 buried in the loading table 16. By this thermal CVD operation, on the surface of the loading table 16, as shown in FIG. 2B, a TiN film is deposited and a thin precoat film 22 is formed.

The process conditions at this time are that when the dimension of the loading table 16 is the 8-inch wafer size, the flow rate of TiCl₄ gas is about 30 to 50 sccm, and the flow rate of NH₃ gas is about 400 sccm, and the flow rate of N₂ gas is about 500 sccm, and the process pressure is about 40 Pa (≈300 mTorr), and the process temperature is about 680° C. The process temperature is not limited to it and any temperature higher than the temperature at which a TiN film can be formed by the thermal CVD, for example, 400° C. or more may be acceptable.

When the deposition step is finished by forming the precoat film 22 with a thickness of, for example, about 1 μm like this, the operation is moved to the stabilization step for stabilizing the precoat film 22. At the stabilization step, in order to stabilize the surface of the TiN precoat film 22 in an imperfect reaction state by annealing as shown in FIG. 2C, the temperature of the loading table 16 is raised to a temperature higher by, for example, about 50° C. than the process temperature at the time of forming the TiN film, that is, up to about 730° C. The rise temperature is not limited to 50° C., and any temperature higher than the TiN film forming temperature is acceptable, and when the temperature is higher, the stabilization process can be performed more quickly.

Note that the process temperature at the stabilization step is not limited to it and note that a temperature equal to the process temperature at the deposition step of the precoat film or any temperature lower than the process temperature may be acceptable though the process time of the stabilization step is prolonged.

As annealing gas at this time, $NH_3$ gas is used, and as dilution gas, $N_2$ gas is used. The process conditions at this time are that the flow rate of $NH_3$ gas is about 1000 sccm, and the flow rate of $N_2$ gas is about 500 sccm, and the process pressure is about 40 Pa ($\approx$300 mTorr) to 1333 Pa ($\approx$10 Torr). When the stabilization process is performed for a predetermined time, for example, about 2 minutes, unstable atoms (site) of the surface of the precoat film 22 are reacted with $NH_3$ gas and changed to TiN perfectly and enters the stable state. By doing this, the precoat film stabilization process is finished.

Hereafter, it is desirable to load a semiconductor wafer in the processing container 4 and perform the normal film forming process, for example, continuously form a TiN film by the thermal CVD, for example, using $TiCl_4$ gas and $NH_3$ gas, for example, at a process temperature of 680° C. When semiconductor wafers W to be processed are used up, the precoat film 22 is chemically stable as mentioned above, so that there is no need to lower the temperature of the loading table 16 as conventionally and it is desirable to perform idling in the state that the temperature is kept at the process temperature, that is, about 680° C. here until a semiconductor wafer to be processed next occurs. Therefore, when a semiconductor wafer to be processed next occurs, since the temperature of the loading table 16 is kept at the process temperature during a period of idling, the film forming process can be started immediately. Therefore, the time required for raising the loading table 16 up to the process temperature can be omitted and the throughput can be improved in correspondence with it.

The forming process of the precoat film 22 and stabilization process thereof as mentioned above are generally performed whenever the processing container 4 is internally cleaned as mentioned above.

Next, the estimation for a thickness of the precoat film 22 will be explained.

Here, the temperature of the loading table 16 is maintained at a constant temperature with high accuracy, for example, 650° C. In this state, the precoat film of various thickness is applied to the loading table 16 and the power consumption of the resistance heater 20 at that time is investigated. The resistance heater is provided with a not-shown structure that divides a plane into two heating zones and that can control temperatures of the heating zones independently of each other.

Figure 3:
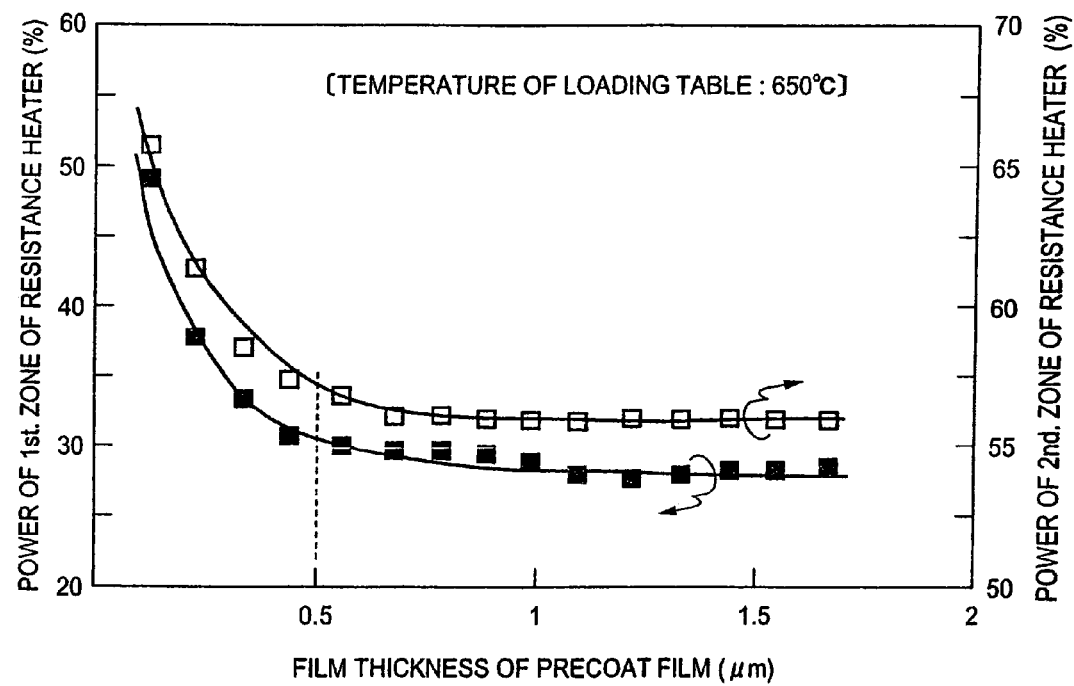
FIG. 3 is a drawing having a graph showing the relationship between the power consumption of a heater and the film thickness of a precoat film.

FIG. 3 is a graph showing the relationship between the film thickness of a precoat film at this time and the power consumption (%) of the resistance heater. In the shown example, the resistance heater is divided into the first zone and the second zone, while the power consumption is represented by percentages in relation to a full-power.

As shown in FIG. 3, in a range where the thickness of the precoat film is thin, the power consumption of the resistance heater 20 changes greatly in comparison with the change in film thickness. This means that since the temperature of the loading table 16 is maintained at a constant temperature of 650° C., the radiation heat quantity discharged from the loading table 16 changes greatly. When the thickness of a precoat film amounts to 0.5 µm, the power consumption is generally stabilized to fall into a constant variable range. That is, it can be understood that when the film thickness of a precoat film is more than 0.5 µm, the radiation heat quantity discharged from the loading table 16 becomes substantially constant.

Further, when a TiN film is formed on a semiconductor wafer within a range where the thickness of the precoat film is thin, the radiation heat quantity discharged from the loading table gradually changes as the thickness of the precoat film gradually changes.

Consequently, the temperature of a shower head in the vicinity of the loading table changes and the amount of precursor (TiClx: x 1-3) of $TiCl_4$ consumed in this part varies, so that the reproducibility for the thickness of a TiN film on semiconductor wafers is deteriorated. Accordingly, it is necessary to stabilize the radiation heat quantity discharged from the loading table 16 in view of an improvement in the reproducibility for the thickness of a TiN film on semiconductor wafers.

Based on the above result, TiN films are actually formed on fifty sheets of semiconductor wafers and the result is now estimated.

Figure 4:
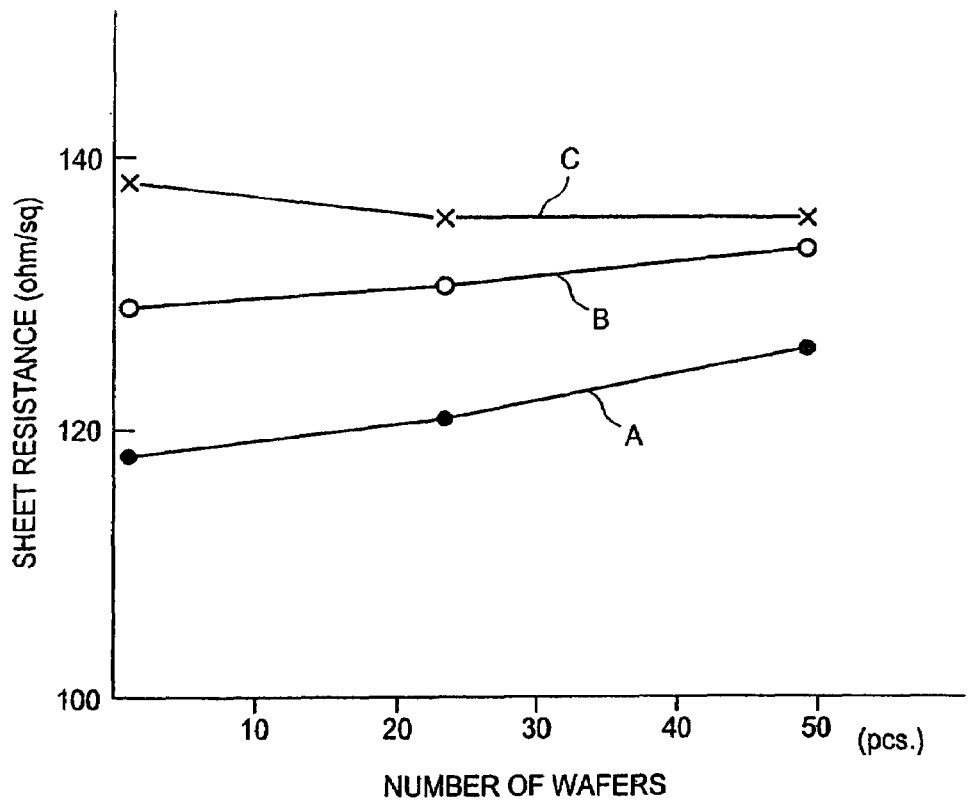
FIG. 4 is a drawing including a graph and a table both showing the relationship between the sheet resistance of a TiN film and the number of semiconductor wafers.

FIG. 4 is a graph showing changes of the sheet resistance when processing fifty sheets of wafers. Noted that since the sheet resistance is in inverse proportion to the film thickness substantially, this relationship therebetween allows the film thickness to be detected through the sheet resistance indirectly.

As shown in the figure, a curve A designates the adoption of a loading table having a precoat film of 0.2 µm in thickness applied thereon, a curve B designates the adoption of a loading table having a precoat film of 0.5 µm in thickness applied thereon, and a curve C designates the adoption of a loading table having a precoat film of 1.0 µm in thickness applied thereon, From the figure, it will be understood that the curve A exhibits a great change and the uniformity in film thickness among the wafers is 3.1%, suggesting an unsatisfactory result.

While, the curve B exhibits a small change and the uniformity in film thickness among the wafers is lowered to 1.5% remarkably and further, the curve C exhibits a smaller change and the uniformity in film thickness among the wafers is lowered to 1.0%, both showing a satisfactory result.

In this case, even if the precoat film is further thickened, the radiation heat quantity from the loading table 16 does not change and becomes substantially constant. In other words, even if a TiN film adheres to the loading table 16 due to the formation process for wafers, there is no change in the radiation heat quantity; nevertheless the maximum thickness of a precoat film is, for example, about 2 im in view of the throughput, preferably, 1.5 µm.

Although, until now $NH_3$ containing gas is used at the stabilization step, $O_2$ containing gas or $H_2O$ containing gas may be used in place of it. FIG. 5 is a drawing showing the condition when the stabilization process is performed using $O_2$ gas and $N_2$ gas as $O_2$ containing gas. The deposition process is performed as explained in FIG. 2B. At the stabilization step shown in FIG. 5, $O_2$ gas is fed in place of $NH_3$ gas previously shown in FIG. 2C. In place of $N_2$ gas as carrier gas, another inert gas, for example, He, Ne, or Ar may be fed.

The process conditions at this time are that the flow rate of $O_2$ gas is about 200 sccm, and the flow rate of $N_2$ gas is about 100 sccm, and the process temperature is about 680° C., and the process pressure is about 133 Pa ($\approx$1 Torr).

In this case, oxygen is rich in activity, so that the process temperature at the stabilization step can be set to 680° C. which is the same as the film forming temperature of the precoat film 22 of a TiN film, accordingly there is no need to change the temperature of the loading table 16 for stabilization of the precoat film, and the film forming process can be performed for a semiconductor wafer immediately after the stabilization process of the precoat film, and the throughput can be improved more in correspondence with it.

By the stabilization process, unstable atoms and molecules (site) of the surface of the precoat film 22 are reacted with $O_2$ gas and changed perfectly to TiO or TiON and enters the stable state. For stabilization, although depending on the $O_2$ gas concentration, when the precoat film 22 is 1 μm in thickness, it is desirable to perform the annealing process at least for about 2 minutes.

The process temperature of the stabilization process using $O_2$ gas, since $O_2$ gas is rich in reactivity as mentioned above, may be lower than the film forming temperature of the TiN precoat film 22 and for example, the TiN precoat film 22 can be stabilized, for example, at about 400° C.

Actually under the aforementioned process conditions, the stabilization process is performed for a TiN precoat film using $O_2$ gas and $N_2$ gas and evaluated, so that the evaluation results will be explained by referring to FIG. 6.

Figure 6:
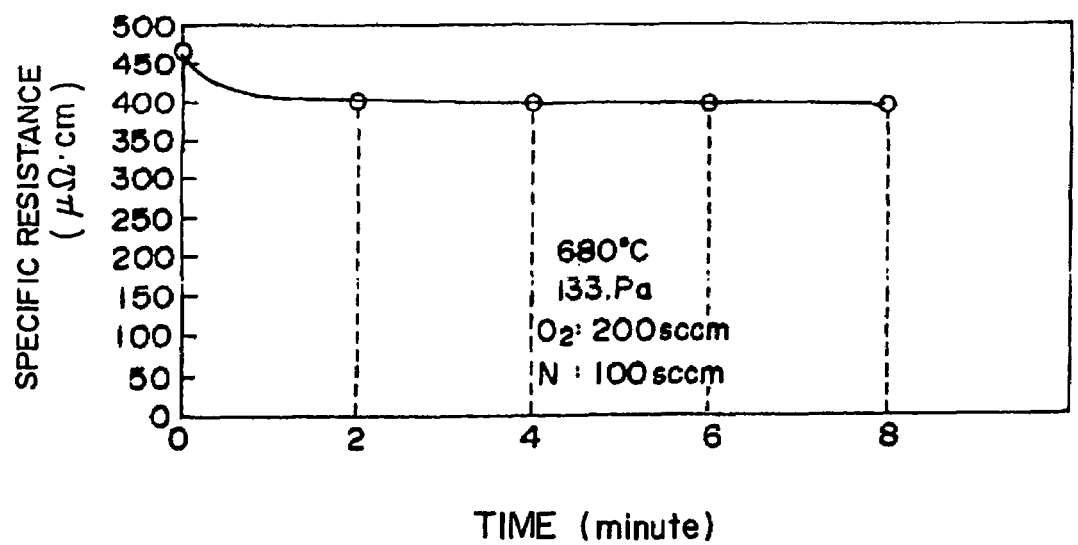
FIG. 6 is a graph showing changes of the specific resistance of a TiN film versus the stabilization annealing time.
Figure 7:
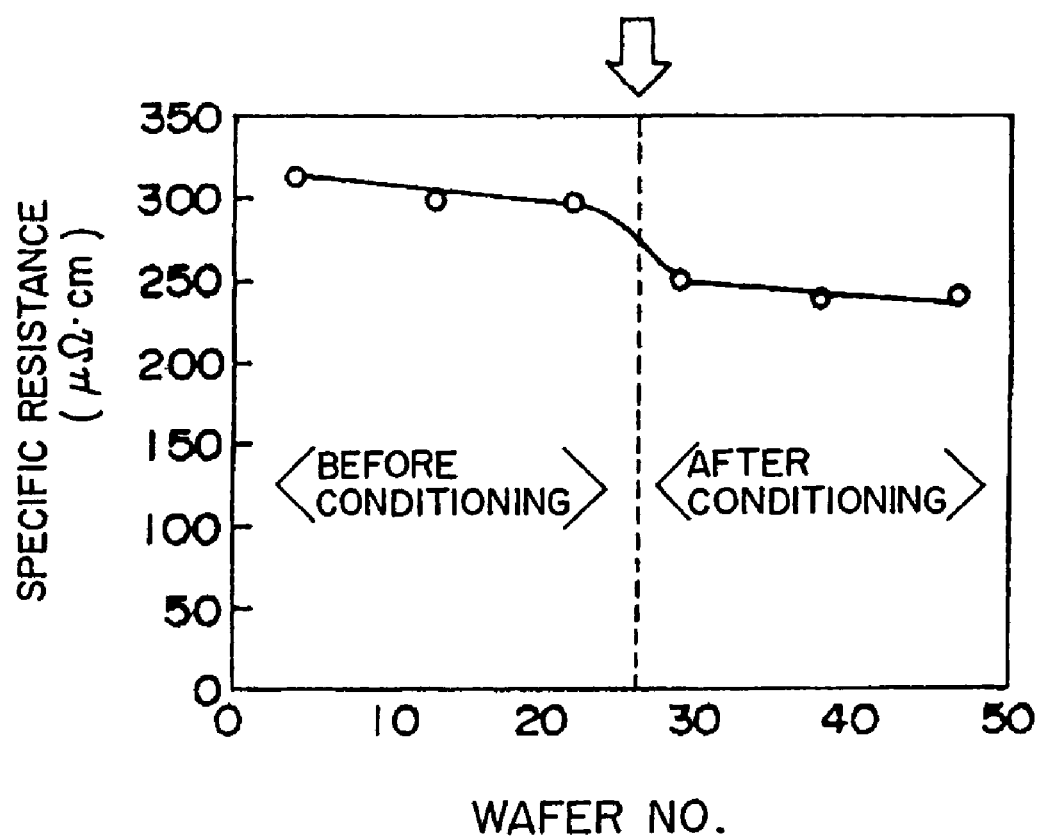
FIG. 7 is a drawing showing changes of the film quality (specific resistance) when a precoat film is deposited in a film forming device and a TiN film is formed immediately and thereafter, when a loading table is conditioned for 17 hours and then a film is formed.
Figure 8:
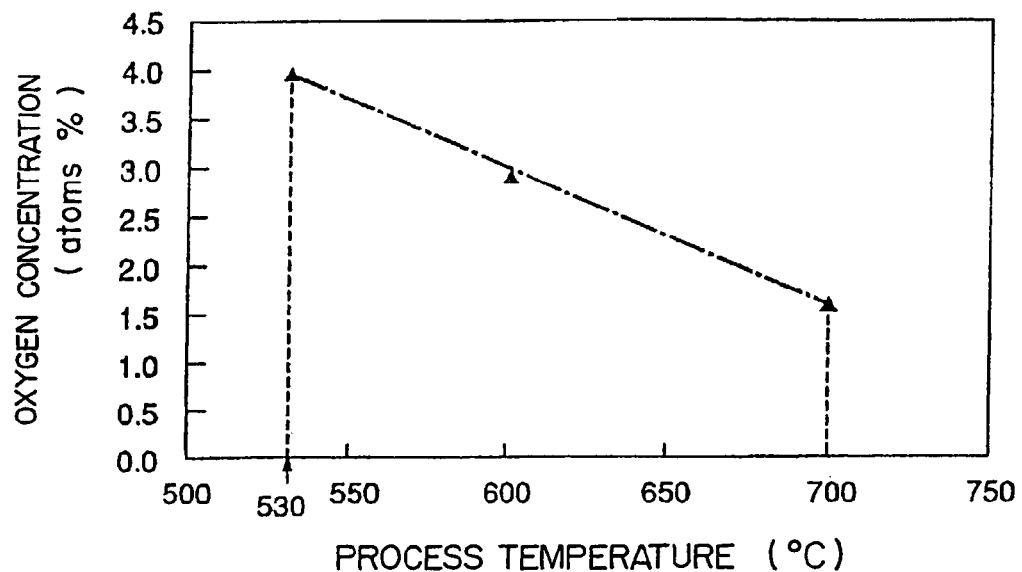
FIG. 8 is a graph showing the relationship between the process temperature at the time of forming a TiN film and the oxygen (O) concentration in the film after conditioning in the atmosphere for 3 days after film forming.
Figure 9:
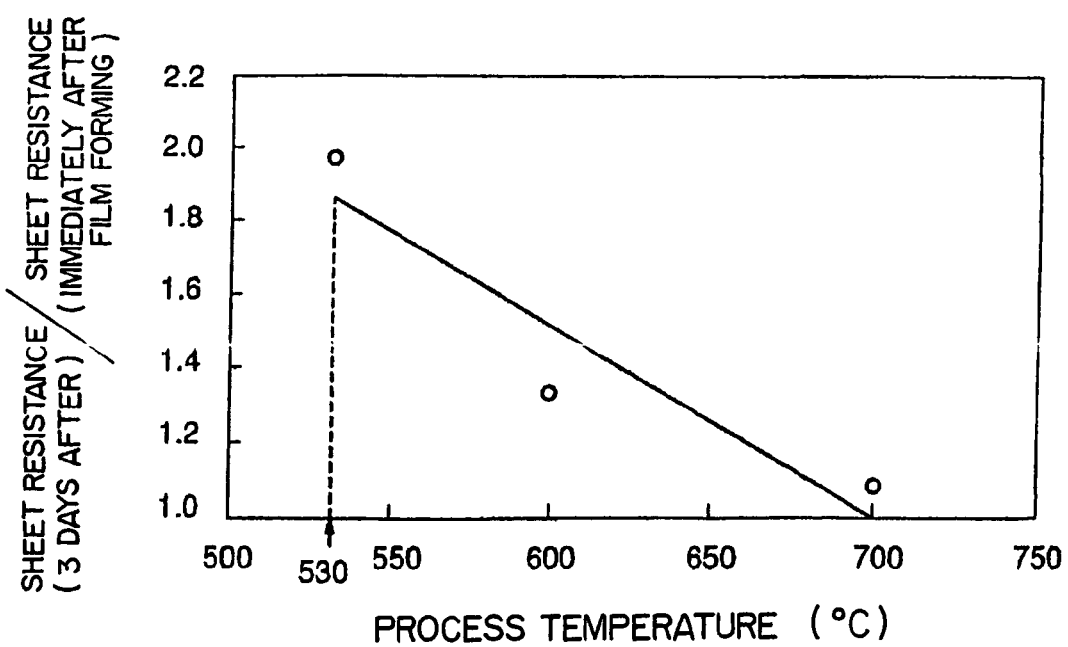
FIG. 9 is a graph showing the process temperature at the time of forming a TiN film and the change rate of the sheet resistance after conditioning in the atmosphere for 3 days after film forming.

FIG. 6 is a graph showing changes of the specific resistance of a TiN film versus the stabilization annealing process. Here, for annealing the precoat film, the stabilization annealing processing time is variously changed to 0, 2, 4, 6, and 8 minutes, and a TiN film is actually deposited on a wafer using a loading table with precoat which is annealed like this, and the specific resistance of the TiN film on the wafer is measured. As clearly shown in the graph, when the $O_2$ annealing process is not performed, the specific resistance is 450 $\mu\Omega \cdot cm$, while when the $O_2$ annealing process is performed for 2 minutes or more, the specific resistance is stabilized at almost 400 $\mu\Omega \cdot cm$. Therefore, it is found that when the $O_2$ annealing process is performed for 2 minutes or more, the TiN precoat film 22 is chemically stabilized.

Further, in view of the stabilization of a precoat film by the above oxidation, the film thickness of the precoat film is an important factor. In order to improve the reproducibility in forming a TiN film on semiconductor wafers, it is desirable that the film thickness is more than 0.5 μm. Even if the precoat film is further thickened, the radiation heat quantity from the loading table 16 does not change and becomes substantially constant. Nevertheless the maximum thickness of a precoat film is, for example, about 2 μm in view of the throughput, preferably, 1.5 μm.

In the aforementioned respective embodiments, the stabilization process of chemically stabilizing the TiN precoat 22 beforehand is performed, thereby the precoat film 22 is prevented from degeneration during idling of the film forming device. However, the present invention is not limited to it and even if the stabilization process is not performed as mentioned above, during idling of the film forming device, by feeding $NH_3$ containing gas (pure $NH_3$ gas is included) continuously in the processing container 4, the same operation effect as the aforementioned can be produced.

Namely, in this case, the stabilization process of the precoat film as shown in FIG. 2C or 5 is not performed, and during idling of the device, $NH_3$ gas and $N_2$ gas are fed continuously into the processing container 4, and by doing this, the TiN precoat film 22 is prevented from degeneration. The gas flow rate at this time, for example, is about 500 sccm for $NH_3$ gas and about 500 sccm for $N_2$ gas. According to this, the unstable part of the surface of the precoat film 22 is occupied by $NH_3$ gas, so that the precoat film 22 is not reacted with other gases. Even in this case, during idling of the device, if the temperature of the loading table 16 is kept at the same temperature as the process temperature when a TiN film is formed on a wafer, for example, 680° C., when it is necessary to form a TiN film on a wafer, the film forming process can be immediately performed without changing the temperature of the loading table 16, so that the throughput can be improved.

In the aforementioned respective embodiments, the film forming device is explained using a device for forming a TiN film on the surface of a semiconductor wafer by the thermal CVD as an example. However, the present invention is not limited to it and the present invention can be applied to all film forming devices for forming a Ti film or a film containing Ti such as TiN. For example, also to a plasma CVD film forming device for forming a Ti film by the plasma CVD using, for example, $TiCl_4$ gas and $H_3$ gas, the present invention can be applied.

As a heating means, also to a device using not only a resistance heater but also a lamp heater, the present invention can be applied. Further, an article to be processed is not limited to a semiconductor wafer and the present invention can be applied also to a glass substrate and an LCD substrate.

As explained above, according to the precoat film forming method, film forming device idling method, loading table structure, and film forming device of the present invention, the following outstanding operation effects can be produced.

According to the present invention, in a film forming device having a loading table for loading an object to be processed inside, the precoat film forming method of the invention includes a deposition step of feeding processing gas inside the film forming device and depositing a precoat TiN film on the surface of the loading table and a stabilization step of reducing and stabilizing the precoat film on the loading table, wherein the precoat film formed on the loading table at the deposition step has a film thickness within a range such that even if the film thickness of the precoat film changes, a radiation heat quantity from the loading table becomes generally constant. Therefore, as the thermal stability is maintained at the film forming process of semiconductor wafers, it is possible to improve the reproducibility in the film forming process.

Also according to the present invention, a precoat film composed of a TiN film can be stabilized by exposing and annealing in $NH_3$ containing gas. By doing this, there is no need to lower the temperature of the loading table during a period of idling of the film forming device, thereby the time required for raising the temperature at start time of film forming for an article to be processed is not required, so that the throughput can be improved in correspondence with it.

According to the present invention, a precoat film composed of a TiN film can be stabilized by exposing and annealing in $O_2$ containing gas or $H_2O$ containing gas. By doing this, there is no need to lower the temperature of the loading table during a period of idling of the film forming device, thereby the time required for raising the temperature at start time of film forming for an article to be processed is not required, so that the throughput can be improved in correspondence with it.

According to the present invention, when the stabilization process is to be performed using $O_2$ containing gas, $H_2O$ containing gas or $NH_3$ containing gas, the temperature is set to almost the same temperature as the process temperature when the film forming process is performed for an article to be processed, thereby a precoat film is stabilized, and then the film forming process for the article to be processed can be performed immediately without raising the temperature of the loading table, so that the throughput can be improved more.

According to the present invention, there is no need to stabilize a precoat film composed of a TiN film, and when $NH_3$ containing gas is just fed during a period of idling, for example, even if the loading table is kept at the film forming process temperature, the precoat film can be prevented from degeneration. Therefore, the time required for raising the temperature at start time of film forming for an article to be processed is not required, so that the throughput can be improved in correspondence with it.

According to the present invention, since the precoat film of the loading table is stabilized, there is no need to lower the temperature of the loading table during a period of idling of the film forming device, thereby the time required for raising the temperature at start time of film forming for an article to be processed is not required, so that the throughput can be improved in correspondence with it.

Next, the embodiment of the film forming method relating to the present invention will be explained.

Firstly, the load lock chamber 74 is evacuated almost to the same pressure as that of the processing container 4 which is set in the vacuum state beforehand and then the gate valve 54 is opened so as to interconnect the chambers 74 and 4. Then, the multi-joint arm 76 is driven, and an unprocessed semiconductor wafer W in the load lock chamber 74 is loaded and transferred into the processing container 4, and it is loaded on the loading table 16.

When the wafer W is loaded like this, the film forming process is started. Here, a TiN film is formed by the thermal CVD using, for example, $TiCl_4$ gas and $NH_3$ gas, for example, at a process temperature of 680° C.

In this case, $N_2$ gas may be used as carrier gas. During the film forming process, as oxidizing gas, for example, $O_2$ gas and $H_2O$ gas (water vapor) are fed into the processing container 4 at the same time at a predetermined flow rate respectively within an unexcessive range, and a deposited film is formed by partial oxidation. Here, as oxidizing gas, $O_2$ gas is used.

The process conditions at this time, in a case of 8-inch wafer size, for example, the process pressure is about 40 Pa (≈300 mTorr), and the process temperature is about 680° C., and the flow rate of $TiCl_4$ gas is about 30 sccm, and the flow rate of $NH_3$ gas is about 400 sccm, and the flow rate of $N_2$ gas is about 50 sccm, and the flow rate of $O_2$ gas is about 5 sccm.

By partial oxidization by $O_2$ gas in this way, a TiN film containing TiON molecules is formed in a thickness of about 20 nm (the film forming time is about 50 seconds).

The sheet resistance of the TiN film containing TiON molecules is measured immediately after film forming and 3 days after film forming respectively. The increase rate (change rate) of the sheet resistance is only about several % and can be suppressed within 5% which is a target and a satisfactory result can be obtained.

Next, the feed amount of $O_2$ gas is changed variously, and the same film forming process is performed, and the sheet resistance is measured. It is desirable to set the feed rate of $O_2$ gas within the range from about 7 to 67% (2 to 20 sccm) of the flow rate of $TiCl_4$ gas which is raw material gas, more preferably, within the range from about 17 to 33% (5 to 10 sccm).

In the aforementioned embodiment, during forming of a TiN film, $O_2$ gas is introduced into the processing container 4 together with raw material gas. However, the present invention is not limited to it and after forming of a TiN film, as a postprocess under existence of a wafer, oxidizing gas may be fed into the processing container 4 for a predetermined time. Namely, in this case, $O_2$ gas which is oxidizing gas is not fed during forming of a TiN film and firstly, a TiN film is deposited by the thermal CVD using the conventional ordinary film forming method. When a TiN film with a predetermined thickness is formed, the wafer is left in the current state without being unloaded, and $TiCl_4$ gas and $NH_3$ gas are stopped feeding, and at the same time, as oxidizing gas, for example, $O_2$ gas is fed into the processing container 4 for a predetermined time, and the surface of the TiN film is oxidized, and a TiON film is formed partially.

The process conditions in this case, as mentioned above, are the same as those when $O_2$ gas is fed during forming of a TiN film, and it is desirable to keep the process pressure and process temperature at 40 Pa and 680° C. respectively and set the flow rate of $O_2$ gas within the range from 2 to 20 sccm, preferably within the range from 5 to 10 sccm. The time of the postprocess may be, for example, within the range from 5 to 30 seconds and when the postprocess is performed for an excessively long period of time, the TiN film is undesirably oxidized excessively.

Even when $O_2$ gas is fed in the postprocess after forming of the TiN film like this, the sheet resistance of the TiN film can be greatly prevented from a change with time and the change of the sheet resistance can be suppressed to less than 5%.

In the aforementioned respective embodiments, a case that $O_2$ gas is used as oxidizing gas is explained as an example. The present invention is not limited to it and another oxidizing gas, for example, $H_2O$ gas (water vapor) may be used.

Here, a case that a TiN film is deposited as a film containing a high-melting point metal is explained as an example. However, the present invention is not limited to it and needless to say, for example, even when a WN (tungsten nitride) film is to be deposited, the method of the present invention can be applied to it.

Furthermore, here, an example that a semiconductor wafer is used as an article to be processed is explained. However, the present invention is not limited to it and the method of the present invention can be also applied to an LCD substrate, a glass substrate, and others.

As explained above, according to the film forming method relating to claim 13, when a nitride film containing a high-melting point metal is to be deposited, a part of it is oxidized and stabilized by feeding oxidizing gas during or after the film forming process, thereby the sheet resistance of the deposited film can be greatly prevented from a change with time.

What is claimed is:

1. A precoat film forming method of a film forming device having a loading table for loading an object to be processed inside, said method comprising:
   (1) raising the temperature of the loading table to a predetermined temperature;
   (2) maintaining the loading table constant at the predetermined temperature while feeding processing gas inside the film forming device to deposit a precoat TiN film on a surface of the loading table until the film reaches a minimum thickness within a range of film thickness, where radiation heat quantity from the loading table becomes constant;
   (3) loading the object onto the loading table, processing the object at a processing temperature lower than the predetermined temperature to form a TiN film on the object, and thereafter removing the object from the loading table;
   (4) idling the film forming device at the processing temperature until a next object is to be loaded onto the loading table for processing; and
   (5) repeating step (3) for the next object.

2. A precoat film forming method according to claim 1, further comprising:
   a stabilization step for stabilizing said precoat TiN film.

3. A precoat film forming method according to claim 2, wherein said stabilization step is carried out by reducing said precoat film.

4. A precoat film forming method according to claim 3, wherein said reducing at said stabilization step is carried out by exposing said precoat film to a reducing gas.

5. A precoat film forming method according to claim 4, wherein said reducing gas is $NH_3$ containing gas.

6. A precoat film forming method according to claim 2, wherein a temperature of said loading table at said stabilization step is higher than a temperature at said processing temperature.

7. A precoat film forming method according to claim 2, wherein a temperature of said loading table at said stabilization step is almost the same as said processing temperature.

8. A precoat film forming method according to claim 1, wherein a thickness of said precoat TiN film is greater than 0.5 μm.

9. A precoat film forming method according to claim 1, wherein in said film forming device, a Ti film or a Ti containing film is deposited on said object to be processed.

10. A precoat film forming method according to claim 1, wherein a thickness of said precoat film is 1 μm-2 μm.

* * * * *